United States Patent [19]

Welsh et al.

[11] Patent Number: 4,651,084
[45] Date of Patent: Mar. 17, 1987

[54] FAULT TEST APPARATUS FOR CONDUCTORS OF MULTICONDUCTOR CABLE

[75] Inventors: Francis X. Welsh, Perkasie, Pa.; Desmond E. McBride, Willingboro, N.J.

[73] Assignee: RCA Corporation, Princeton, N.J.

[21] Appl. No.: 688,981

[22] Filed: Jan. 4, 1985

[51] Int. Cl.[4] .................................................. G01R 31/02
[52] U.S. Cl. ...................................... 324/51; 340/661
[58] Field of Search .................. 324/51, 54, 66, 73 R; 340/660–663, 650–652; 179/175.3 F

[56] References Cited

U.S. PATENT DOCUMENTS

| | | | |
|---|---|---|---|
| 3,528,104 | 9/1970 | Ehlschlager | 324/51 |
| 3,728,616 | 4/1973 | Cheek et al. | 324/51 |
| 3,986,106 | 10/1976 | Shuck et al. | 324/66 X |
| 4,227,146 | 10/1980 | Hodge | 324/51 |
| 4,518,953 | 5/1985 | Hunter et al. | 340/652 X |

Primary Examiner—Reinhard J. Eisenzopf
Assistant Examiner—Jack B. Harvey
Attorney, Agent, or Firm—Joseph S. Tripoli; William Squire

[57] ABSTRACT

Two parallel chains of resistances of like value are coupled between a pair of terminals to which a test voltage is applied. One chain is formed by connecting each cable conductor between a different pair of resistances in alternating serial fashion. A plurality of comparators each compare the potentials at nodes between pairs of corresponding resistances in each chain. The outputs of the comparators are coupled to a NAND gate for giving a fault indication when the output of one of more comparators changes state in response to one or more sensed faults.

9 Claims, 2 Drawing Figures

FAULT TEST APPARATUS FOR CONDUCTORS OF MULTICONDUCTOR CABLE

This invention relates to apparatus for testing the conductors of a multiconductor cable for faults.

BACKGROUND OF THE INVENTION

By way of example, one fault testing apparatus is disclosed in U.S. Pat. No. 3,728,616. This apparatus tests for wiring errors in connections between various pairs of terminals. The apparatus includes a plurality of pairs of matched resistors with one pair of terminals connected in series between each respective pair of resistors. Each series connection is across a voltage source. The voltage across one resistor of each pair is sensed by a detector, a separate different detector corresponding to each resistor pair, to determine the voltage above or below a predetermined range of voltages at each resistance pair representing a defectively wired circuit. Each pair of matched resistors has values differing sufficiently from the values of every other pair of resistors to enable detection of crossed or erroneous connections. In multiconductor cables having a large number of conductors, for example 50 to 100 conductors, such a test apparatus becomes relatively costly and complex due to the relatively large number of corresponding differing resistance values and detectors employed.

Further, a power supply is provided having a number of different voltage outputs. The disclosed detector circuit employs five different voltages, by way of example. Employing a plurality of voltage supplies also is relatively complex and costly to implement.

A cable tester for locating shorts and discontinuities in multiconductor cables is disclosed in U.S. Pat. No. 4,227,146. There are open and short circuit detectors disclosed, each conductor under test having a separate set of open and short detector lights. For a large number of cables, for example 50 conductors or more, the disclosed system would therefore require at least 100 indicating lights. Such a large number of lights are difficult to manually scan to determine a fault condition on a repetitive basis for long periods of time and is visually fatiguing.

SUMMARY OF THE INVENTION

An apparatus for testing the conductors of a multiconductor cable for faults according to the present invention comprises first and second terminals for receiving an applied test voltage. Means including first resistance means serially couples the conductors between the first and second terminals to create separate, different test potentials at nodes between different conductors, the potential drop between various nodes being substantially equal. At least one of the test potentials tends to shift in value in the presence of at least one fault in any of the conductors. A second resistance means creates a plurality of separate, different reference potentials, each having a corresponding test potential. Means compares the test potential at each node to its corresponding reference potential and for producing a signal at a first given logic level when the corresponding potentials differ by at least a given relative value and for producing a second signal at a second given logic level when the corresponding potentials do not differ by at least that value.

DESCRIPTION OF THE PREFERRED EMBODIMENT

Figure 1:
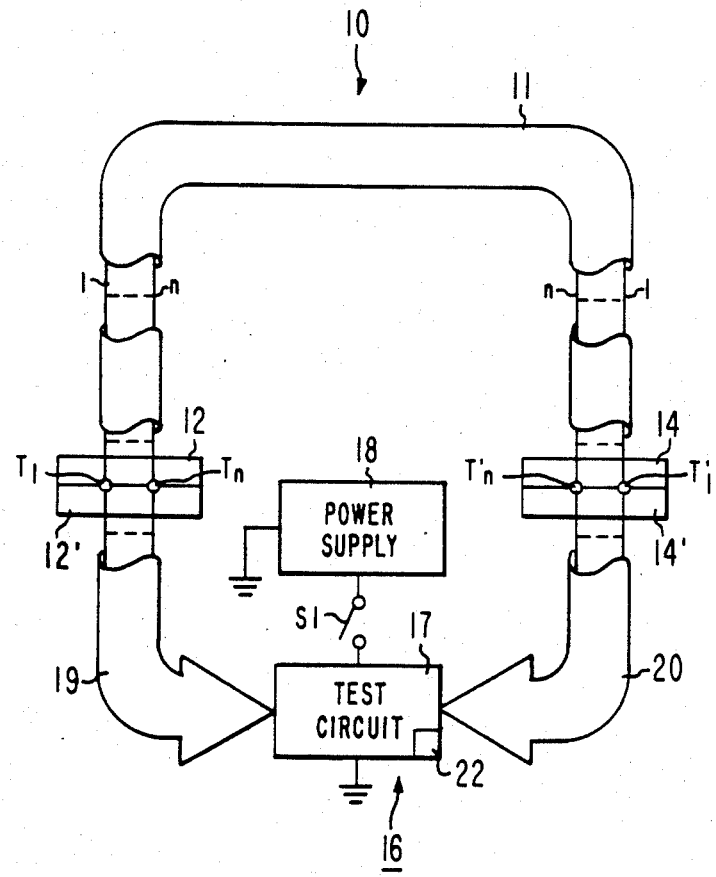
FIG. 1 illustrates, diagrammatically, an apparatus for testing the conductors of a multiconductor cable for faults.

In FIG. 1, cable 10 under test comprises electrically insulated conductors 1-n encased in an insulating jacket 11 and terminated in connectors 12 and 14 at opposite cable ends. Terminals $T_1$-$T_n$ terminate the conductors 1-n, respectively, in connector 12. Terminals $T_1'$-$T_n'$ terminate conductors 1-n, respectively, in connector 14. There may be 50 or more conductors in the cable 10. These conductors need to be tested for continuity, i.e., conductivity between their ends, for example, such as between terminal $T_1$ and $T_1'$ for conductor 1; for shorts between adjacent conductors; for opens in a given conductor; and for miswiring. In miswiring, by way of example, conductor 1 may be connected to another terminal other than terminal $T_1$ or $T_1'$.

Apparatus 16 tests for the continuity of the conductors 1-n, shorts, miswires, and opens in the different conductors. Apparatus 16 includes a test circuit 17, a power supply 18 coupled to the test circuit through switch S1, a cable 19 which couples the test circuit to connector 12' which mates with connector 12, and a cable 20 which couples the test circuit 17 to connector 14' which mates with connector 14. The test circuit 17 includes an indicator 22, which may be a single light source. Alternatively, the indicator 22 may be a connecting jack for interfacing a computer with the test circuit 17.

For test purposes in a manufacturing environment, it is most essential that the cable 10 be tested rapidly and efficiently for faults. In a manufacturing environment, the present inventors realize that it is not essential to test each conductor during its assembly to the remaining system for individual fault identification. That is, it is not necessary to identify a specific fault in a specific conductor 1-n, e.g., short, open, miswire, and so forth. The apparatus 16 of the present invention, after inserting the connector 12 into its mating test connector 12' and the connector 14 into its mating test connector 14' and closing switch S1, immediately gives an operator a fault indication via indicator 22, if the cable under test has one or more faults.

Should a fault be indicated, the operator merely disconnects the cable 10 from the test apparatus 16 holding it aside for further evaluation. In the meantime, a second cable is connected to the test apparatus 16 and tested. All of this testing can take place rapidly. This is to be compared to prior art systems in which an operator may have to scan several hundred light indicators and do this repetitively during a workday. Such repetitive scanning of light indicators can be extremely fatiguing and inefficient.

Figure 2:
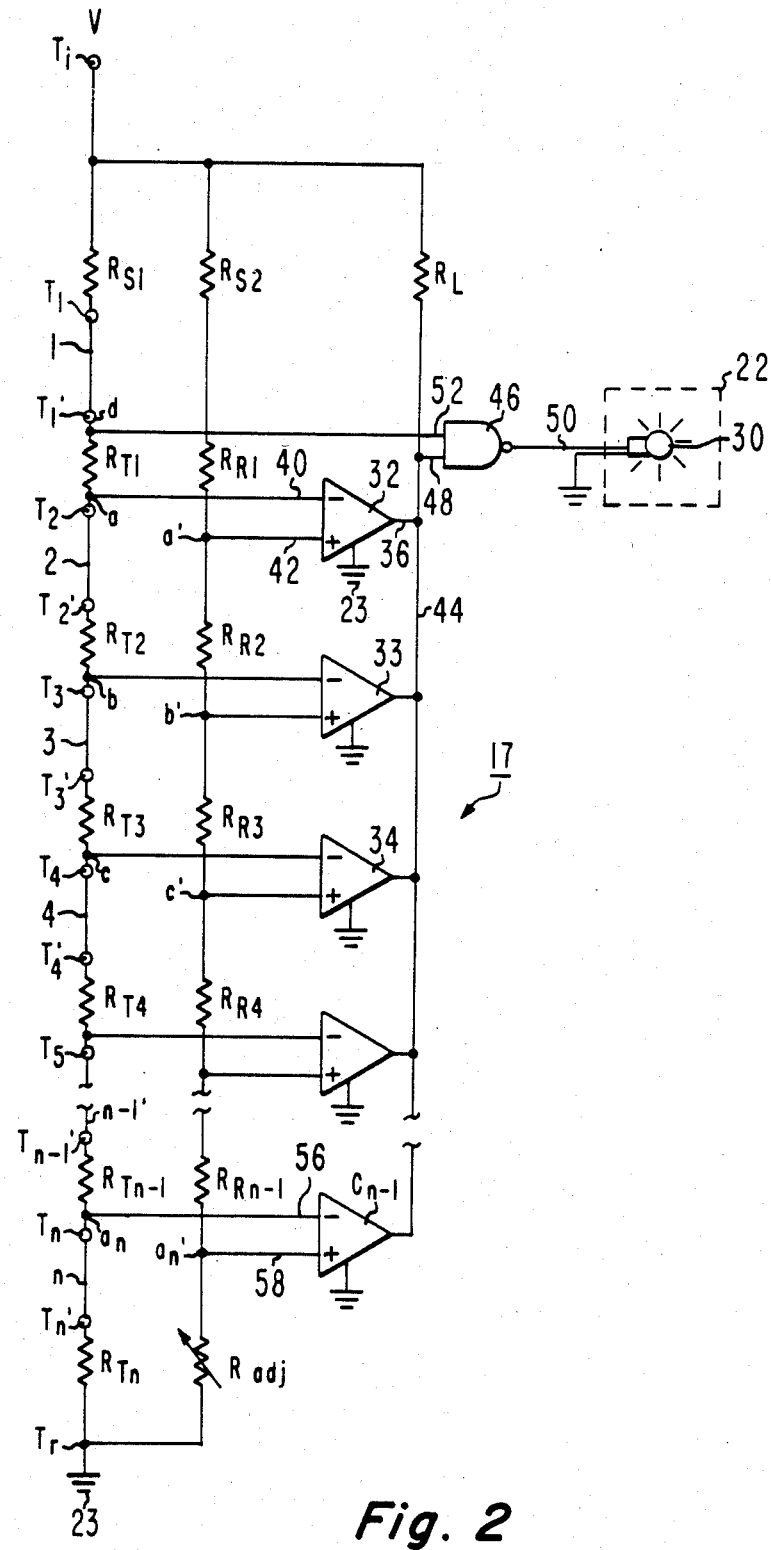
FIG. 2 is a circuit schematic diagram of the apparatus of FIG. 1 in accordance with one embodiment of the present invention.

In circuit 17, FIGS. 1 and 2, the power supply 18 supplies a voltage V between terminals $T_i$ and $T_r$. In FIG. 2, terminal $T_r$ is connected to system ground represented by symbols 23. Current limiting resistance $R_{S1}$ is connected between terminals $T_i$ and $T_1$. Test resistance $R_{T1}$ is connected between terminals $T_1'$ and $T_2$, test resistance $R_{T2}$ is connected between terminals $T_2'$ and $T_3$, test resistance $R_{T3}$ is connected between terminals $T_3'$ and $T_4$, and so forth. Test resistance $R_{Tn}$ is connected between terminals $T_n'$ and terminal $T_r$. These resistances all have substantially the same value within a small tolerance range and therefore create substantially the same voltage drop thereacross. For example, resistances $R_{T1}$-$R_{Tn}$ are precision type resistors having a tolerance within plus or minus one percent of the nominal specified value of that resistance. By way of example, if the nominal value of resistor $R_{T1}$ is 100 ohms it may have a value of 99-101 ohms. The same is true for all remaining resistances $R_{T1}$-$R_{Tn}$. Current limiting resistance $R_{S1}$ has a value which is approximately ten times the value of one of test resistance $R_{T1}$-$R_{Tn}$. By way of further example, if $R_{T1}$ has a value of 100 ohms, then the value of $R_{S1}$ may be about 1,000 ohms. The value of $R_{S1}$ is not critical, but should be, in general, about 10 $R_{t1}$, and is not dependent on the value of n.

When cable 10 is connected to the test circuit each conductor 1-n is serially connected between a different pair of resistors $R_{S1}$ and $R_{T1}$-$R_{Tn}$ to form a voltage divider between terminals $T_i$ and $T_r$. Specifically, conductor 1, FIG. 2, is connected between terminals $T_1$ and terminal $T_1'$ and, therefore, between current limiting resistance $R_{S1}$ and test resistance $R_{T1}$. Conductor 2 is connected between terminals $T_2$ and $T_2'$ and is connected between test resistances $R_{T1}$ and $R_{T2}$. This arrangement continues in serial fashion for all conductors in cable 10.

The serial arrangement may be referred to as a "daisy chain." Because of the alternating arrangement of test resistors and cable conductors, i.e., one conductor is between a pair of test resistances, the potentials at each conductor of the voltage divider can be calculated knowing the resistance values and the voltage V. A fault in any given cable conductor, e.g., conductor 2, such as a short, open or miswiring as will be explained, will cause a shift in the serial connection of the test resistors such that at least one node corresponding to the junction of a conductor with a test resistance will exhibit a shift in the level of its potential. That is, a fault will cause the interdigitized relation of cable conductors and resistors to shift in conductive relation so that a test resistance may be bypassed or a cable conductor bypassed shifting the level of the potentials at the affected nodes.

By making all of the test resistances $R_{T1}$-$R_{Tn}$ the same value within the tolerance range given, each node between a test resistance and its conductor 12 terminal, for example, the node a between test resistance $R_{T1}$ and terminal $T_2$, has a known potential. That potential corresponds to the quality of a separate different conductor, e.g., conductor 2, assuming all cable conductors have substantially the same resistance between their connecting terminals. The node b between resistance $R_{T2}$ and terminal $T_3$ has a potential corresponding to the potential at conductor 3 and in practice is a node between resistances $R_{T2}$ and $R_{T3}$. Similarly, the node c between test resistance $R_{T3}$ and terminal $T_4$ is in practice between resistance $R_{T3}$ and $R_{T4}$ and is the potential at conductor 4 and so forth for the length of the resistance-cable chain. As the resistors $R_{T1}$-$R_{Tn}$ in the chain are of substantially equal value, the potential between terminal $T_1'$ and $T_r$ is divided into equal drops between sequentially numbered conductors. Regardless the number of resistances in the chain, the potentials at each node thus have a predetermined given value. Therefore, as many test resistances $R_T$ as needed for a given implementation may be placed serially in circuit. This is relatively easy to implement and requires no specially designed circuitry to implement for large numbers of conductors under test. It is not the value of the potential differences between the conductors that matters, but the absolute value of the potentials at the nodes and the fact that they are ascertainable. Further, because all resistances employed in the chain have the same value they tend to respond uniformly to a given set of environmental conditions. For example, if the environmental thermal conditions vary, the value of the resistances in the chain tend to vary uniformly in response to such thermal changes, providing a reliable, stable circuit.

In FIG. 2, reference chain of resistances $R_{S2}$ and $R_{R1}$-$R_{Rn-1}$, and $R_{adj}$ are serially connected between terminals $T_i$ and $T_r$ to form a second voltage divider. Resistance $R_{S2}$ is a current limiting resistance of substantially the same value as current limiting resistance $R_{S1}$. Reference resistances $R_{R1}$-$R_{Rn-1}$ all have substantially the same value and each match the value of and correspond to a separate, different test resistance $R_{T1}$-$R_{Tn-1}$. Resistances $R_{R1}$-$R_{Rn-1}$ may be precision resistors selected from the same tolerance population as the test resistors $R_{T1}$-$R_{Tn-1}$. The chain of resistances $R_{S2}$ and $R_{R1}$-$R_{adj}$ are in parallel with the chain of resistances $R_{S1}$ and $R_{T1}$-$R_{Tn}$. Because the test resistances and reference resistance all have about the same value it is relatively simple to implement circuit 17 for any number of conductors.

A test node is formed by the connection between a test resistance and a terminal of connector 12. Each test node has a corresponding reference node in the reference resistance chain. For example, the node a between test resistance $R_{T1}$ and terminal $T_2$ has a corresponding node a' between reference resistors $R_{R1}$ and $R_{R2}$. Node b corresponds to node b' and so forth. Resistances $R_{S1}$ and $R_{T1}$ are serially connected between terminal $T_i$ and node a. Similarly, resistances $R_{S2}$ and $R_{R1}$ are serially connected between terminal $T_i$ and node a'. Therefore, assuming all conductors of the cable connected to circuit 17 are good and have no faults, the potentials at nodes a and a' will match. Similarly, the potentials at nodes b and b' match, the potentials at nodes c and c' match, and so forth for all paired test and reference nodes.

Comparators 32, 33, 34 through $C_{n-1}$ test the respective nodes a—a', b—b', c—c' and so forth for matched potentials. Comparators 32-$C_{n-1}$ are identical and therefore the description of comparator 32 is representative. Comparator 32 has an inverting input 40 and a non-inverting input 42. Inverting input 40 is coupled to test node a and non-inverting input 42 is connected to reference node a'. Comparator 32 compares the potentials on inputs 40 and 42. When the potential on input 40 exceeds the potential on input 42 by a given threshold level, the output of the comparator will be at ground potential. As long as the potential at input 40 is the same as or lower than the potential at input 42, a positive output level is produced. All of the other comparators 33-$C_{n-1}$ operate similarly, each comparing the potential at a test node to the potential at the corresponding reference node. Output 36 of all comparators is connected to line 44 which is connected to terminal $T_i$ through load resistance $R_L$. $R_L$ is not critical but should have a value commensurate with the related circuitry. For example, in Transistor-Transistor Logic (TTL) circuits of the type described in the present embodiment, $R_L$ can have a value in the range of 5K to 10K ohms.

As long as the inverting inputs are at potentials approximately equal to or lower than the potentials at the non-inverting input, the output of each comparator will be at a potential other than system ground, and the potential on line 44 is a logic "1." When any one comparator has its inverting input at a potential above the potential of its non-inverting input the comparator is triggered when the differential is greater than a given amount, i.e., when the differential exceeds the comparator differential threshold input value. In this example, a 0.003 volt differential will trigger the comparators in one implementation where the $R_T$'s and $R_R$'s are each about 100 ohms. In this state the comparator drops the potential on line 44 to system ground, placing a logic "0" level on line 44. By way of example, one type of comparator, known as RCA CA3302E, an integrated circuit, responds to a potential difference threshold between inputs 40 and 42 of about 0.003 volts.

NAND gate 46 has an input 48 connected to line 44 for sensing the logic levels on line 44 and another input 52 coupled to terminal $T_1'$. The output 50 of NAND gate 46 is connected to one terminal of lamp 30 having another terminal connected to ground. When all of the conductors 1-n of the cable are properly connected, i.e., no faults exist, a high logic level will be present at both inputs to NAND gate 46. Therefore, the output of NAND gate 46 will be at a low logic level and lamp 30 will not light. If either or both inputs of NAND gate 46 is low, then a high output level will be produced illuminating indicator lamp 30. A fault in the cable under test will produce a low level at at least one input of the NAND gate.

For example, a short circuit in conductor 1 to another conductor, such as conductor 2, will bypass resistance $R_{T1}$. This will tend to raise the potential on input 40 of comparator 32. As mentioned above, an increase of the potential on the inverting input 40 will cause output 36 to go low to a "0," causing a fault indication at the output of NAND gate 46. Further, any miswiring of terminal $T_1$ or $T_1'$ to another terminal such as terminal $T_4$ or terminal $T_5$, by way of example, also bypasses resistance $R_{T1}$ and other resistances and will cause a similar raise in potential at input 40 and at other comparator inverting inputs. The only fault in conductor 1 not indicated by any of the comparators is an "open" in conductor 1. This will cause all negative input potentials to the comparators to go to a lower value and a fault will not be sensed.

Thus, the only test necessary for conductor 1 is the continuity test. Should conductor 1 be open, terminal $T_1'$ will be at a low potential which when coupled to input 52 of NAND gate 46 will produce a high output or fault indication regardless of the potential at input 48. Alternatively, this continuity test could be made by employing another comparator similar to comparator 32.

The advantage of the NAND gate is that it also permits resistances to be placed between V at terminal $T_i$ and the inputs of the nearest comparator, e.g., comparator 32, to reduce the value of the voltages at the inputs of that comparator to below an acceptable maximum operating value for that comparator. Further, it also provides a buffered TTL voltage operating level inverted to a positive logic output, i.e., a logic level "1" indicates a failure. That is, the comparator circuitry is electrically isolated from the indicator 22 operating voltage to permit a wider variety of comparators to be employed. For example, some comparator circuits may have output power levels insufficient to drive indicator 22. NAND gate 46 permits higher currents to be used to drive indicator 22.

In operation, if conductor 3 opens, i.e., represents an infinite resistance, comparators 34-$C_{n-1}$ will not sense a fault since the test node potentials at their inverting inputs will not exceed the reference node potentials at their non-inverting inputs. However, comparators 32 and 33 coupled to nodes a and b between open conductor 3 and input terminal $T_i$ will sense a fault and couple line 44 to ground. The potentials at the inverting inputs of comparators 32 and 33 will rise above the potentials at their non-inverting inputs. As a further example, if conductor 2 and conductor 3 are shorted, i.e., coupled by a low resistance conductive path, resistance $R_{T2}$ is bypassed and the potentials on the test node b-$a_n$ of comparators 33-$C_{n-1}$ inverting inputs will rise above the reference node potentials at nodes b'-$a_n'$ of the non-inverting comparator inputs. The outputs of these comparators will go to a logic level zero, causing gate 46 input 48 to go low, e.g., "0," and cause the gate 46 output to go high, e.g., "1," illuminating light 30. Any miswiring such as connecting of conductor 2 to the terminals of conductor 4 and so forth have the same effect as a short circuit, causing the potentials at one or more of the test nodes, for example nodes a, b, and so forth, to rise above the respective reference voltage at the reference nodes such as nodes a', b', and so forth.

To calibrate circuit 17, a known good cable is placed in the circuit so that its conductors 1-n are serially in circuit between terminals $T_i$ and $T_r$ as shown in FIG. 2. With that cable, the potentials at the test nodes a—$a_n$ should all match or be below the potentials at the corresponding reference nodes, nodes a'-$a_n'$. Resistor $R_{adj}$ compensates for variations in potentials at the reference nodes due to the tolerance range of the resistances and due to particular resistances exhibited by a given cable type to be tested. For example, some resistances $R_T$ or $R_R$ may have values of 99 ohms as compared to other resistances which may have values of 101 ohms. $R_{adj}$ compensates for these variations and sets the potentials at the reference nodes substantially equal to the test node potentials within the threshold range of the comparators, i.e., the indicator light 30 is off. While it is possible that the potentials at the corresponding test and reference nodes may not be exactly the same, they may be adjusted so the compared potentials are within the desired comparator threshold range so that a fault condition in the test cable will cause a significant rise in potential on one or more of the comparators' inverting inputs.

Combinations of resistance values may be made other than by matching the values of the test resistors $R_T$'s to the values of the reference resistors $R_R$'s. For example, the resistance values of the reference chain may be of equal value but, could differ from the values for the test resistor chain, which also are of equal value. Such difference in values between the test resistances and reference resistances, however, would also require different relative values of the current limiting resistance $R_{S1}$ and $R_{S2}$. This may require a resetting of the resistance value of $R_{adj}$. However, it is simpler and more straightforward to let all values in the chains be substantially the same and let the value of $R_{S1}$ be the same as $R_{S2}$.

The comparators 32-$C_{n-1}$ are relatively simple, inexpensive integrated circuits which are thermally and mechanically stable in the presence of a variety of environmental thermal and vibration conditions. By using comparators of the type described, the present circuit is considerably more stable than prior art cable test circuits in the presence of a variety of test environment conditions resulting in enhanced electrical noise immunity and temperature insensitivity due to the intrinsic high common mode rejection ratios of comparators. In other words, environmental factors do not significantly affect the comparator differential threshold input value. Further, all components of the circuit tend to vary uniformly in value in response to the environmental factors to permit use of the test apparatus in a factory environment. Further, because all of the test resistances have the same value, it is relatively simple to test a large number of cable conductors, for example several hundred, if necessary.

All that is required is that the desired number of test nodes in the resistance chain be established for a given cable size. All test and reference potentials are automatically established with no particular criticality to those potentials. Because the logic level of the signal on line 44 is either one of two discrete levels, it is a simple matter to interface line 44 or the output 50 of NAND gate 46 with a computer for providing computer test results. Also, a single output voltage power supply is all that is employed in the present implementation regardless the number of test nodes used.

What is claimed is:

1. Apparatus for testing the conductors of a multiconductor cable for faults comprising:
   first and second terminals for receiving an applied test voltage;
   means including first resistance means for serially coupling said conductors between said first and second terminals to create a plurality of separate, different test potentials at corresponding separate nodes at each conductor in response to said applied test voltage, the potential drop between various adjacent nodes being substantially equal, at least one of the test potentials tending to shift in value in the presence of at least one fault in any of the conductors;
   second resistance means connected between said first and second terminals for creating a plurality of separate, different reference potentials in response to said applied voltage, each reference potential corresponding to a different test potential; and
   means for comparing the test potential at each node to its corresponding reference potential and for producing a signal at a first given logic level when the corresponding potentials differ by at least a given relative value and for producing a signal at a second given logic level when the corresponding potentials do not differ by at least said value.

2. The apparatus as in claim 1 further including indicator means responsive to said first logic level signal.

3. The apparatus of claim 1 wherein said means for creating different test potentials includes means for coupling resistances of substantially the same known value between different pairs of conductors to form a single serial chain with said conductors.

4. Apparatus for testing the conductors of a multiconductor cable for faults comprising:
   a pair of terminals;
   means for applying a voltage across said pair of terminals;
   a plurality of test resistances;
   means for serially connecting the conductors and said test resistances between said terminals so that one test resistance is connected between a given pair of conductors, said connecting means forming a plurality of test nodes between each pair of test resistances;
   a reference voltage divider chain of resistances connected between said terminals and having a reference node between each resistance, each reference node corresponding to a given test node to form a node pair; and
   means for comparing the voltage potentials at each node pair and providing an indication of a fault when said potentials differ by at least a given value.

5. The apparatus of claim 4 wherein all said test and reference resistances have substantially the same value.

6. The apparatus of claim 4 wherein said means for comparing includes a comparator for each node pair, each comparator having a separate different input coupled to a separate different node of that node pair; and
   logic means responsive to the outputs of all said comparators for providing a signal manifesting said fault.

7. The apparatus of claim 4 wherein at least one of the resistances in said voltage divider is adjustable for setting the potentials at the reference nodes to a given reference potential relative to the value of the potentials at the corresponding test nodes.

8. The apparatus of claim 4 wherein said means for comparing includes:
   logic means responsive to said potentials at each pair of nodes for producing a fault signal when the potential at at least one of the test nodes rises above the potential present at the corresponding reference node of that node pair; and
   means responsive to the fault signal from said logic means to produce said fault indication.

9. The apparatus of claim 4 further including:
   a first current limiting means connected between one of said pair of terminals and said reference voltage divider; and
   a second current limiting means connected between one of said pair of terminals and said means for connecting said test resistances.

* * * * *